United States Patent
Paranjpe et al.

(10) Patent No.: US 7,354,848 B2
(45) Date of Patent: Apr. 8, 2008

(54) POLY-SILICON-GERMANIUM GATE STACK AND METHOD FOR FORMING THE SAME

(75) Inventors: Ajit Paranjpe, Fremont, CA (US); Kangzhan Zhang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/420,940

(22) Filed: May 30, 2006

(65) Prior Publication Data

US 2006/0231925 A1    Oct. 19, 2006

Related U.S. Application Data

(62) Division of application No. 10/943,424, filed on Sep. 17, 2004.

(51) Int. Cl.
*H01L 21/3205* (2006.01)
(52) U.S. Cl. .............. 438/592; 438/654; 438/660; 438/663; 257/E21.624
(58) Field of Classification Search ......... 438/588, 438/592, 652, 654, 657, 653, 658, 660, 661, 438/663; 257/E21.624
See application file for complete search history.

(56) References Cited

U.S. PATENT DOCUMENTS

| | | | |
|---|---|---|---|
| 5,291,030 A | 3/1994 | Brors | |
| 5,551,985 A | 9/1996 | Brors et al. | |
| 5,972,800 A | 10/1999 | Hasegawa | |
| RE36,957 E | 11/2000 | Brors et al. | |
| 6,162,716 A * | 12/2000 | Yu et al. | 438/592 |
| 6,167,837 B1 | 1/2001 | Cook | |
| 6,235,652 B1 | 5/2001 | Cook | |
| 6,287,635 B1 | 9/2001 | Cook | |
| 6,321,680 B2 | 11/2001 | Cook | |
| 6,552,583 B1 | 3/2002 | Brors et al. | |

(Continued)

FOREIGN PATENT DOCUMENTS

WO   WO 2004036636   4/2004

OTHER PUBLICATIONS

Watanabe et al., entitled: "An advanced technique for fabricating hemispherical-grained (HSG) silicon storage electrodes" by IEEE Transactions on Electron Devices. vol. 42, No. 2 Feb. 1995. pp. 296-300.

(Continued)

*Primary Examiner*—Matthew Smith
*Assistant Examiner*—Julio J Maldonado
(74) *Attorney, Agent, or Firm*—Patterson & Sheridan, LLP (57) ABSTRACT

A CMOS gate stack that increases the inversion capacitance compared to a conventional CMOS gate stack has been described. Using a poly-SiGe gate, instead of the conventional poly-Si gate near the gate dielectric layer, increases the amount of implanted dopant that can be activated. This increase overcomes the polysilicon depletion problem that limits the inversion capacitance in the conventional CMOS gate stack. To integrate the poly-SiGe layer into the gate stack, a thin $\alpha$-Si layer is deposited between the gate dielectric layer and the poly-SiGe layer. To ensure proper salicide formation, a poly-Si layer is capped over the poly-SiGe layer. In order to obtain a fined-grained poly-Si over poly-SiGe, a second $\alpha$-Si layer is deposited between the poly-Si layer and the poly-SiGe layer.

18 Claims, 9 Drawing Sheets

U.S. PATENT DOCUMENTS

| | | | |
|---|---|---|---|
| 6,552,594 | B2 | 3/2002 | Cook |
| 6,373,112 | B1 | 4/2002 | Murthy et al. |
| 6,506,691 | B2 | 1/2003 | Cook et al. |
| 6,710,407 | B2 * | 3/2004 | Yamamoto .................. 257/344 |
| 6,780,464 | B2 | 8/2004 | Cook et al. |
| 6,855,641 | B2 * | 2/2005 | Ryu et al. .................... 438/767 |
| 6,878,580 | B2 * | 4/2005 | Bae et al. .................... 438/198 |
| 2003/0025165 | A1 | 2/2003 | Kim et al. |
| 2003/0124799 | A1 * | 7/2003 | Ping et al. .................. 438/255 |
| 2003/0203560 | A1 | 10/2003 | Ryu et al. |
| 2004/0067631 | A1 * | 4/2004 | Bu et al. ..................... 438/592 |
| 2004/0099860 | A1 | 5/2004 | Doris et al. |
| 2004/0238895 | A1 | 12/2004 | Mutou |

OTHER PUBLICATIONS

PCT Partial Search Report for International Application No. PCT/US2005/031953 dated Aug. 28, 2006.

Rhee, et al. "A New Double-Layered Structure for Mass-Production-Worthy CMOSFETS with poly-SIGe gate," 2002 Symposium on VLSI Technology. Digest of Technical Papers. Honolulu, Jun. 11-13, 2002, Symposium on VLSI Technology, pp. 126-127.

Uejima, et al. "Highly Reliable Poly-SIGe/amorphous-SI Gate CMOS" Electron Devices Meeting, 2000. IEDM Technical Digest. International Dec. 10-13, 2000, pp. 445-448.

PCT International Search Report and the Written Opinion for International Application No. PCT/US2005/031953 dated Oct. 6, 2006.

* cited by examiner

POLY-SILICON-GERMANIUM GATE STACK AND METHOD FOR FORMING THE SAME

CROSS-REFERENCE TO RELATED APPLICATIONS

This application is a divisional application of co-pending U.S. patent application Ser. No. 10/943,424, filed Sep. 17, 2004 (APPM/9575); which is incorporated by reference herein.

BACKGROUND OF THE INVENTION

1. Field of the Invention

The embodiments of the present invention relate to a poly-silicon-germanium (poly-SiGe) gate stack for semiconductor device and a method for forming the same.

2. Description of the Related Art

Transistor drive currents and hence switching speeds for CMOS (complementary metal oxide semiconductor) devices increase with increasing inversion capacitance. One of the factors that limit inversion capacitance is charge carrier depletion in conventional poly-Si gate electrodes during inversion. Alternative gate electrode materials for CMOS devices used in high performance logic circuits are needed to circumvent polysilicon (or poly-Si) depletion.

Using metal gates, whose charge carrier concentrations exceed the carrier concentration of poly-Si by at least two orders of magnitude, virtually eliminates the poly-Si depletion effect. However, the integration of metal gates into a conventional CMOS flow is complicated due to process integration difficulties. Primarily, metal gates lack the thermal and chemical stability that is necessary to survive subsequent high temperature anneals. Deposition and patterning of metal gates are also presently immature.

An alternative approach is to use poly-SiGe (poly-silicon-germanium) gates instead of conventional poly-Si gates. Germanium (Ge) incorporation into poly-Si enhances doping to increase the amount of implanted dopants that can be activated. This is particularly true of dopants such as boron. The higher dopant activation results in a higher charge carrier concentration and a concomitant reduction in gate electrode depletion during inversion. In addition, SiGe is a mid-gap semiconductor material so that threshold voltages for NMOS and PMOS devices are almost equal in magnitude with opposite polarity. Complementary threshold voltages are necessary for proper CMOS circuit operation. A further advantage of poly-SiGe is that the material is chemically similar to poly-Si. This calls for minimal adjustment to the process integration scheme to accommodate poly-SiGe. Poly-SiGe is thermally stable and can survive the thermal cycling that devices are subjected to during the fabrication sequence.

SUMMARY OF THE INVENTION

The embodiments of the present invention provide a poly-SiGe gate for a CMOS device that reduces charge carrier depletion.

In one embodiment, a gate stack for semiconductor MOS device comprises a dielectric film formed on a semiconductor substrate of said semiconductor MOS device, a first $\alpha$-Si layer formed on the dielectric film, a poly-SiGe layer formed on the first $\alpha$-Si layer, a second $\alpha$-Si layer formed on the poly-SiGe layer, and a poly-Si layer formed on the second $\alpha$-Si layer.

In another embodiment, a method of depositing an $\alpha$-Si layer on a substrate comprises placing the substrate in a chamber, introducing a first Si-containing source gas into the chamber, and introducing a second Si-containing source gas into the chamber until an $\alpha$-Si layer of less than about 50 Å thickness has been deposited on said substrate.

In another embodiment, a method of forming a gate stack on a substrate comprises depositing a thin dielectric layer on top of the substrate, depositing a first $\alpha$-Si layer on the dielectric film, depositing a poly-SiGe layer on the first $\alpha$-Si layer, depositing a second $\alpha$-Si layer on the poly-SiGe layer, and depositing a poly-Si layer on the second $\alpha$-Si layer.

BRIEF DESCRIPTION OF THE DRAWINGS

So that the manner in which the features of the invention described herein are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. Also note that the drawings are not to scale.

DETAILED DESCRIPTION

Poly-SiGe gates, where the concentration of Ge is between about 5 atomic % to about 40 atomic %, reduce gate electrode depletion during inversion, but they cannot be deposited directly on a $SiO_2$-based gate dielectric because Ge etches the gate oxide resulting in volatile GeO formation.

GeO formation inhibits the growth of a high quality poly-SiGe film. This chemical incompatibility makes it desirable to incorporate a thin α-Si (amorphous silicon) layer in between the gate dielectric and the poly-SiGe.

Insertion of an undoped α-Si layer in between the poly-SiGe and gate dielectric, however, exacerbates the dopant depletion problem. This problem can be rectified if the α-Si layer is thin enough so that it gets doped during subsequent high temperature processing by out-diffusion of Ge and other dopants from the adjoining poly-SiGe layer. Experimentally it has been found that the α-Si layer must be at least 30-50 Å. If this layer is too thin, it runs the danger of Ge attack of the gate dielectric, since the Ge can diffuse through the weak points in the poly-SiGe film during subsequent high temperature processing. If the layer is too thick, dopant depletion, one of the primary motivations for using poly-SiGe gate electrodes, is not mitigated, and may even increase. Also, the work function of the gate electrode depends on the work function of the material adjacent to the gate electrode. If the α-Si is too thick it will exhibit the work function of poly-Si after anneal. If the α-Si is sufficiently thin, Ge from the adjoining poly-SiGe will diffuse into the α-Si during subsequent thermal annealing and alter the work function to that of poly-SiGe.

A fine-grained poly-Si or poly-SiGe is also desirable. First, with a fine grain size, implanted dopants are more uniformly distributed across the grain. For large grained films, dopants may segregate at the grain boundaries diminishing the electrically active dopant concentration. Secondly, fine-grained films generally result in etched lines with smooth edges. Line edge roughness for gate electrodes can increase sub-threshold slope and threshold voltage spread, both of which are undesirable in high performance devices. Thirdly, silicide formation and transformation of the silicide from the initial as-formed high-resistivity phase to the lower resistivity phase following thermal anneal is favored by a finer grain size.

One way to improve the morphology of poly-Si deposited on poly-SiGe is to insert a thin α-Si layer in between the poly-SiGe and poly-Si layers. The α-Si layer can retain its amorphous microstructure during poly-Si deposition. The growth of poly-Si on poly-SiGe with an intervening layer of α-Si will not be hetero-epitaxial. Therefore, the poly-Si grain structure will be more akin to that obtained when the film is deposited directly on an amorphous surface, such as an $SiO_2$ layer.

Figure 1:
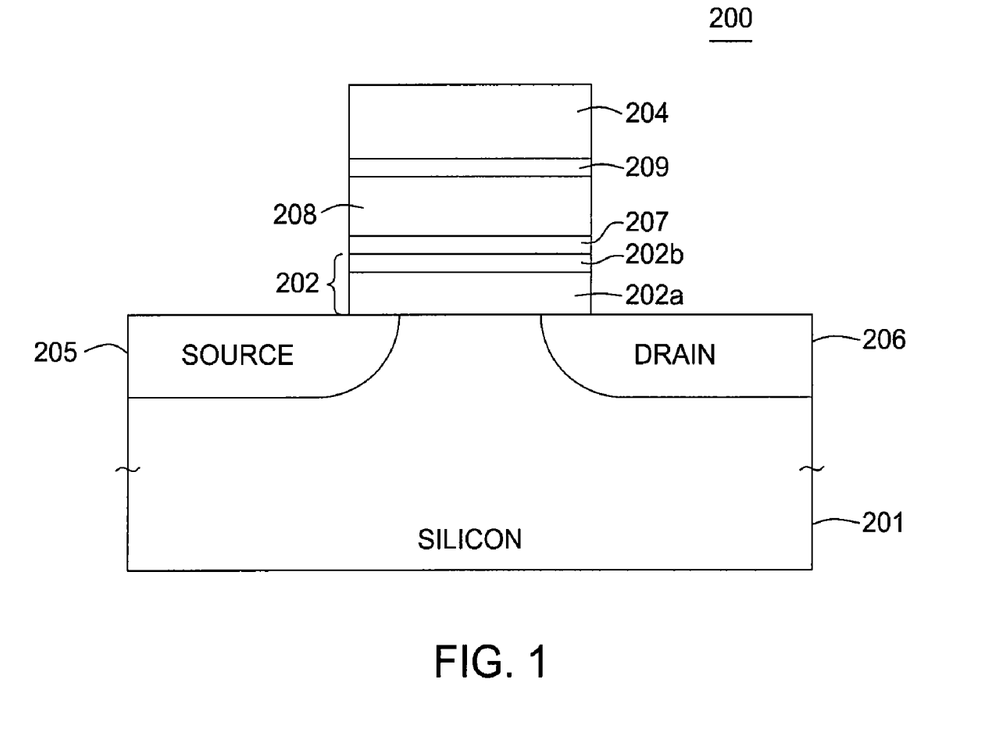
FIG. 1 show a gate stack structure of an embodiment of the current invention.

FIG. 1 shows a gate stack that includes a poly-SiGe layer. On a silicon substrate 201, a thin gate dielectric layer 202 is formed by depositing silicon dioxide 202a, to a thickness between about 20 Å to about 150 Å, and an oxynitride to a thickness between about 20 Å to about 100 Å. Alternatively, the thin gate dielectric layer 202 may include just the silicon dioxide layer 202a. A thin α-Si layer 207 is formed on top of the thin dielectric layer 202. The thickness of the thin α-Si layer 207 is between about 30 Å to about 50 Å. Following the thin α-Si layer 207, a poly-SiGe layer 208 is deposited to a thickness between about 300 Å to about 1000 Å. On top of the poly-SiGe layer 208 a thin α-Si layer 209 is deposited to a thickness between about 50 Å to about 300 Å. A poly-silicon gate 204 is formed on top of the thin α-Si layer 209 to a thickness between about 300 Å to about 1500 Å. Source region 205 and drain region 206 are formed respectively on either side of and partially under the thin dielectric layer 202.

Deposition of the thin α-Si layer 207, poly-SiGe layer 208 and thin α-Si layer 209 can be achieved by employing novel sequencing of process gases and use of alternative process gases in reactors that are amenable to rapid gas flow and temperature cycling. The invention is illustratively described below with reference to a mini-batch low pressure chemical vapor deposition (LPCVD) system, FlexStar, such as those commercially available from Applied Materials, Inc. of Santa Clara, Calif. However, it should be understood that the invention has utility in other system configurations such as single-wafer LPCVD systems or other applicable LPCVD systems. All of the experiments reported here were performed on FlexStar system. The relevant details of the FlexStar system and its application to CVD processes can be found in commonly assigned U.S. Pat. No. 6,353,593, issued on Mar. 5, 2002, and U.S. patent application Ser. No. 10/216,079, filed Aug. 9, 2002, both of which are incorporated herein by reference.

This FlexStar system utilizes cross wafer gas flow, i.e., the process gases flow across the wafer surface. Cross wafer gas flow has several advantages for this application. First, reactant and dopant concentrations are uniform across the surface of the wafer. Secondly, each wafer receives the same dose of reactants resulting in good wafer-to-wafer uniformity. Thirdly, the residence time of the gases in the vicinity of the wafer can be controlled through the gas flow. Control of gas residence times is crucial for ultra-thin depositions in which film deposition must begin simultaneously across the wafer. Residence times also define the extent of gas phase reactions.

The wafer temperature can also be cycled for different process steps in a sequential process. For a poly-SiGe/poly-Si stack, the process temperature has to be increased by about 100° C. while transitioning from deposition of poly-SiGe to deposition of poly-Si. Temperature cycling is difficult to implement in a conventional vertical diffusion furnace, but the unique architecture of the FlexStar system makes this possible.

Figure 2A:
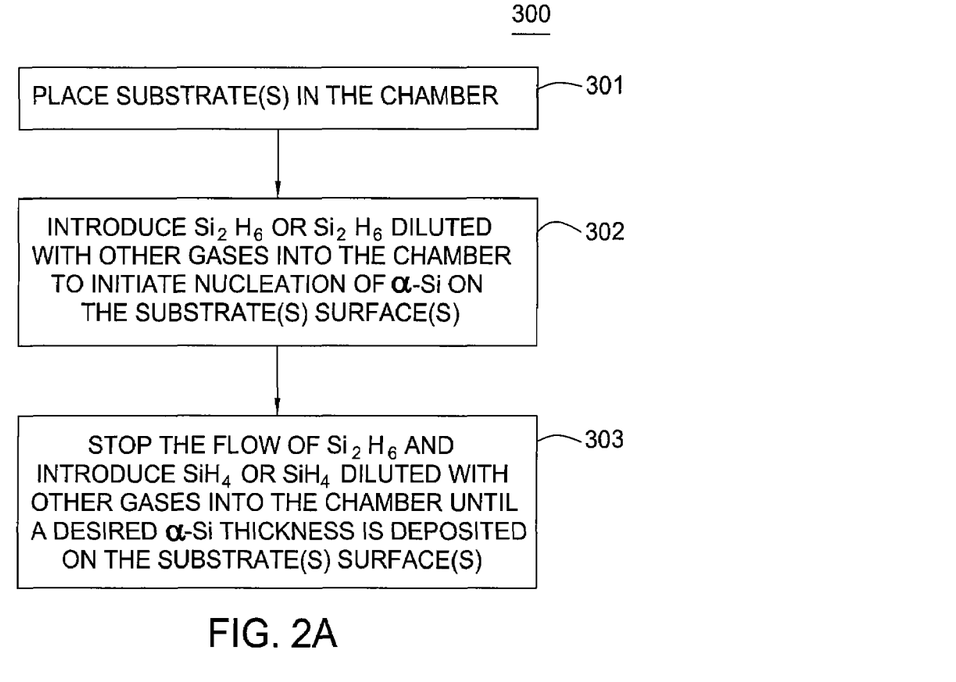
FIG. 2A shows the process flow of deposition a thin $\alpha$-Si layer.

The method 300 according to the invention includes the following steps shown in FIG. 2A. First, one or more substrates are placed in the process chamber at step 301. Afterwards, a flow of $Si_2H_6$ (a Si-containing source gas) or $Si_2H_6$ diluted with other non-reactive gases, such as $N_2$, Ar, $H_2$ or He, is introduced into the chamber for a short duration to initiate the nucleation of α-Si on the substrate surface at step 302. The nucleation period should be less than 5 minutes to enable deposition of the thin α-Si film 207 shown in FIG. 1. After nucleation has been established, the flow of $Si_2H_6$ is stopped and a flow of $SiH_4$ (a Si-containing source gas) or $SiH_4$ diluted with other gases, such as $N_2$, Ar, $H_2$ or He, is introduced into the chamber until the desired thickness (30-50 Å) of α-Si is deposited at step 303.

Figure 2B:
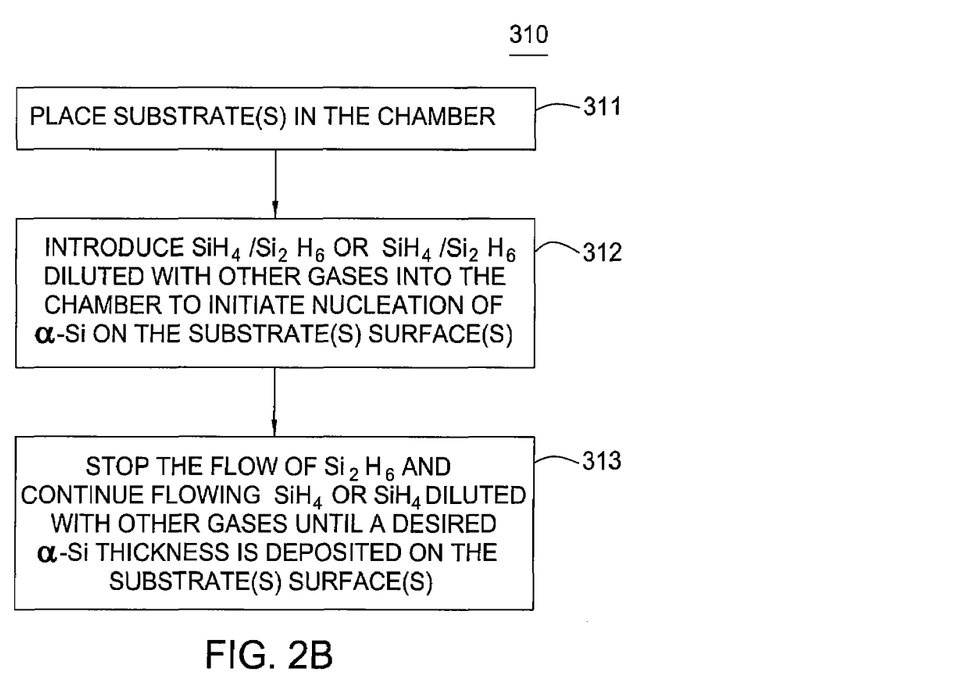
FIG. 2B shows another process flow of depositing a thin $\alpha$-Si layer.

Alternatively, as shown in FIG. 2B, the method 310 according to the invention includes the following steps. First, one or more substrates are placed in the process chamber at step 311. Afterwards, a flow $SiH_4/Si_2H_6$ gas mixture, or $SiH_4/Si_2H_6$ diluted with other non-reactive gases, such as $N_2$, Ar, $H_2$ or He, is introduced into the chamber for a short duration to initiate the nucleation of α-Si on the substrate surface at step 312. The nucleation period should be less than 5 minutes to enable depositing the thin α-Si film 207 shown in FIG. 1. After the nucleation has been established, the flow of $Si_2H_6$ is stopped and the flow of $SiH_4$ (or $SiH_4$ diluted with other gases, such as $N_2$, Ar, $H_2$ or He) is continued until the desired thickness (30-50 Å) of α-Si is deposited on top of the substrate at step 313.

Using the methods described above, nucleation delays can be reduced to nearly zero and an adequately low deposition rate can be achieved for controllable deposition of 30-50 Å α-Si films. A specific example of processing conditions for the modified process to deposit a 50 Å α-Si seed layer are described below.

EXAMPLE 1

Process to deposit a 50 Å α-Si Seed Layer

Step 1: 0.2 slm $Si_2H_6$, 2.0 slm $SiH_4$, 0.0 slm diluent $N_2$, 0.4 Torr, 520° C., for for 30 seconds.
Step 2: 0.0 slm $Si_2H_6$, 2.0 slm $SiH_4$, 0.0 slm diluent $N_2$, 0.4 Torr, 520° C., 150 seconds.

EXAMPLE 2

Process to deposit a 50 Å α-Si seed layer

Step 1: 0.15 slm $Si_2H_6$, 2.3 slm diluent $N_2$, 0.4 Torr, 520° C., 30 seconds.
Step 2: 2.0 slm $SiH_4$, 0.0 slm diluent $N_2$, 0.4 Torr, 520° C., 60 seconds.

Only the key process steps are described above. A complete process sequence also includes steps to stabilize the gas flows and wafer temperature prior to deposition, and chamber pump/purge steps that are performed following the deposition but prior to removing the substrates from the reactor. Also, the gas sequencing concept can be applied over a wide range of process conditions and the specific choice of process conditions for α-Si are dependent primarily on the reactor configuration. Further, although the method has been described for $SiH_4$ and $Si_2H_6$ since these are the most commonly used silicon containing source gases for poly-Si, other silicon containing source gases may be used in the invention.

The result of the process according to the invention is that the seed layer is thin yet continuous as evidenced by the low surface roughness of the film. With a conventional process, the inventors observed the roughness (Ra) of 100 Å α-Si to be approximately 1.3 nm. The high surface roughness and the high $R_{max}$ value of 25 nm suggest that the film is semi-continuous. Surface roughness drops to less than 0.3 nm and $R_{max}$ drops to less than 4 nm with the process according to the invention indicating that the film is continuous.

Characterization of the surface roughness and crystalline structure of the poly-SiGe deposited on the α-Si seed layer can be used to assess the effect of an improved α-Si seed layer on the poly-SiGe film.

EXAMPLE 3

Figure 3:
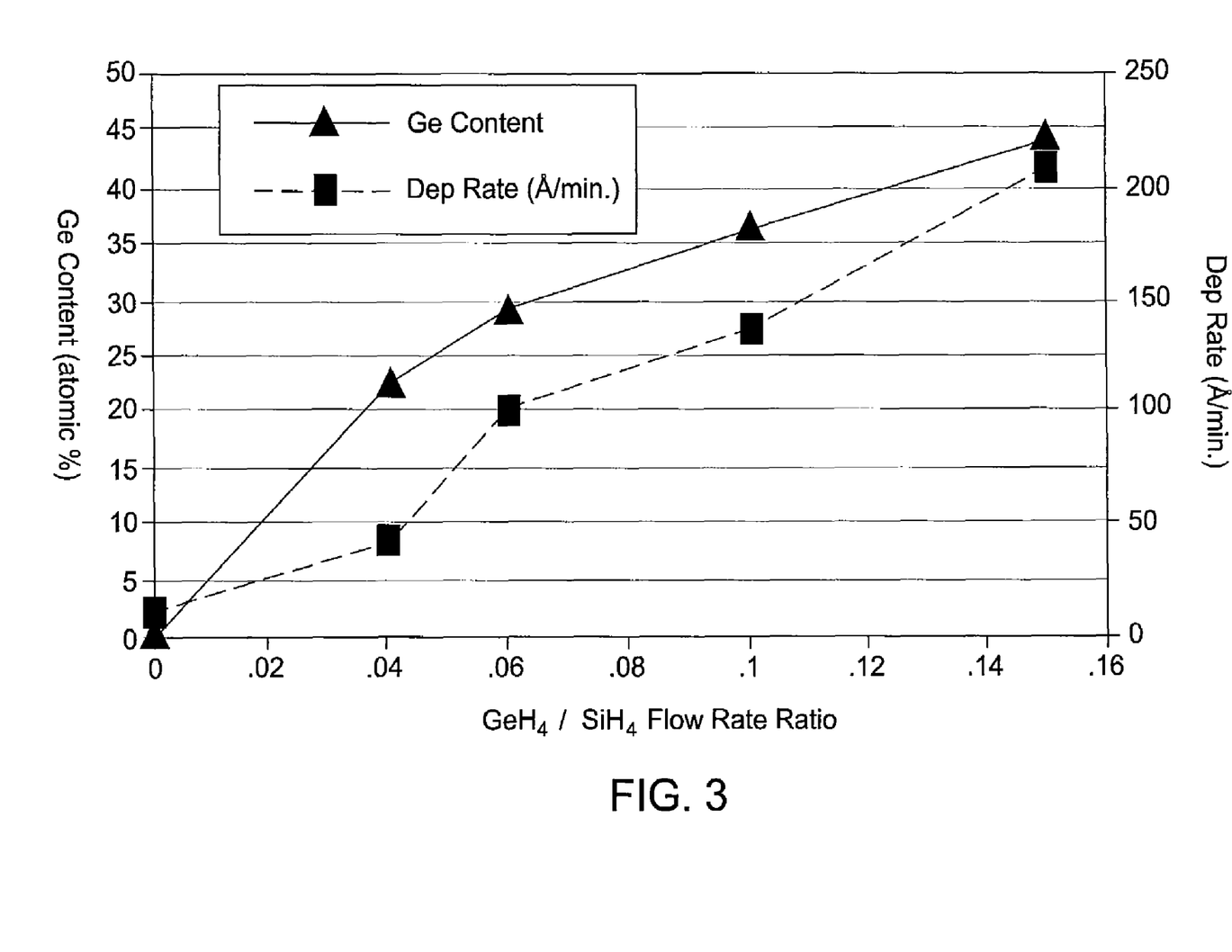
FIG. 3 shows the effect of $GeH_4$:$SiH_4$ flow ratio on the poly-SiGe deposition rate and the Ge content in the film.

Process to Deposit a Poly-SiGe Layer on the α-Si Seed Layer 2.0 slm $SiH_4$, 0.12 slm $GeH_4$, 0.0 slm diluent $N_2$, 0.4 Torr, 520° C., 600 seconds. The $GeH_4$:$SiH_4$ flow ratio can be modulated to adjust the Ge content in the film from pure α-Si to about 50 atomic % Ge (see FIG. 3). FIG. 3 shows the Ge content and deposition rate of poly-SiGe as a function of $GeH_4$/$SiH_4$ ratio.

Figure 4:
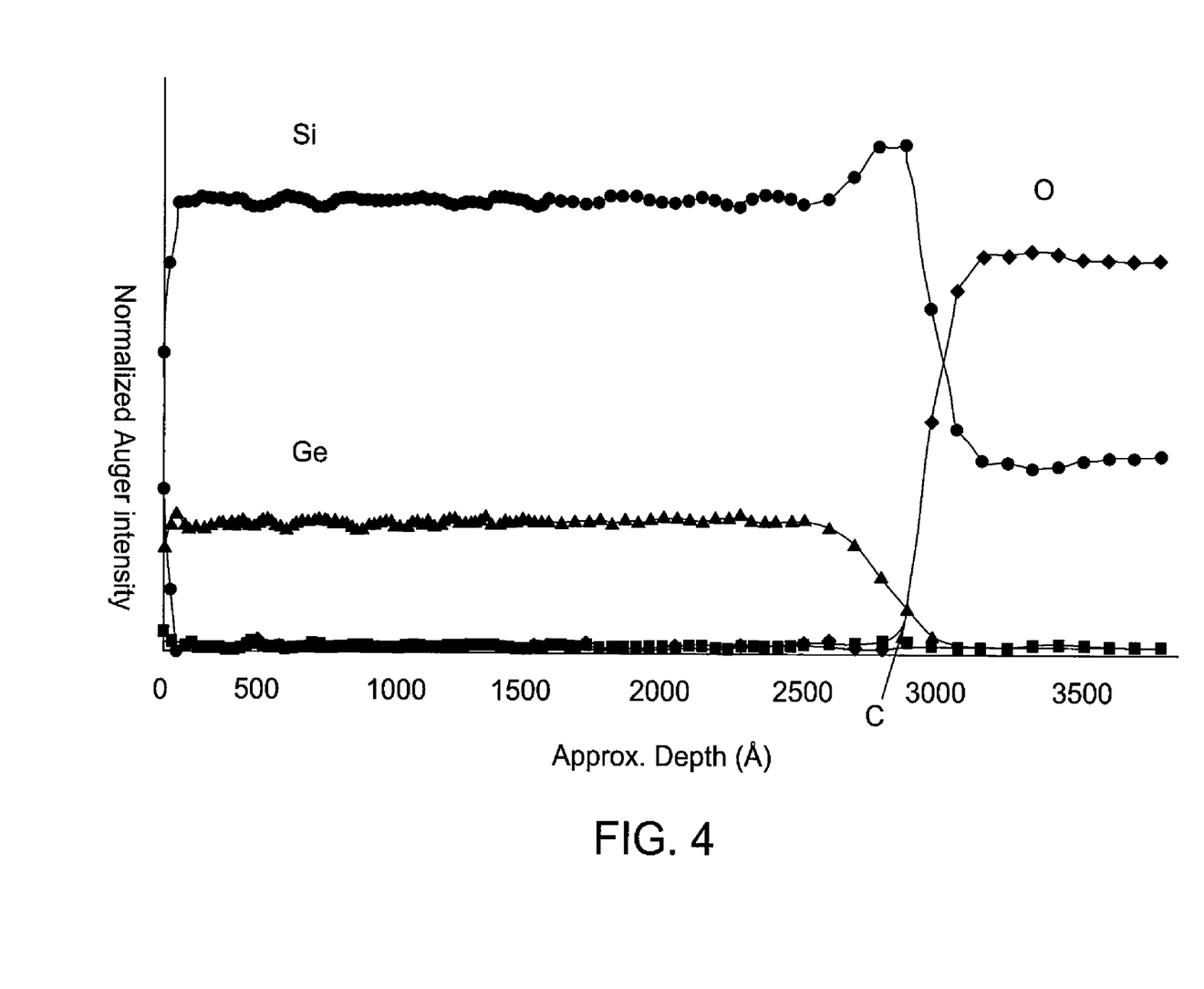
FIG. 4 shows Auger analsis result of Ge incorporation in the poly-SiGe film.

Auger analysis shows that the poly-SiGe deposition process results in uniform Ge incorporation through the film (FIG. 4). As shown in FIG. 4, the α-Si seed layer is present at the interface with the oxide. The Ge content derived from Vegard's law which uses lattice spacing to estimate Ge content is in good agreement with Auger analysis (i.e. to within a few atomic %) confirming that the Ge occupies substitutional sites.

Figure 5:
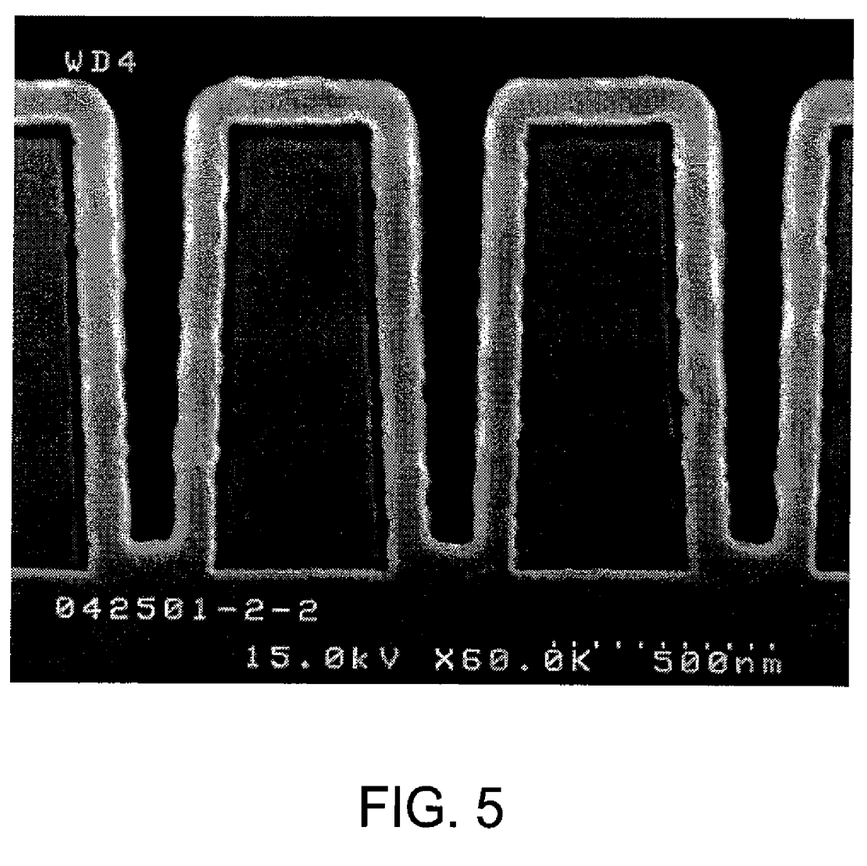
FIG. 5 shows conformal deposition of poly-SiGe, where the Ge content is 23 atomic %.

The poly-SiGe film is also very conformal (see FIG. 5). The unique architecture of the parallel wafer processing reactor results in uniform film deposition, with 0.70% thickness uniformity for a 1617 Å film. The uniformity is defined by dividing the standard deviation of the thickness to the mean thickness.

Figure 6A:
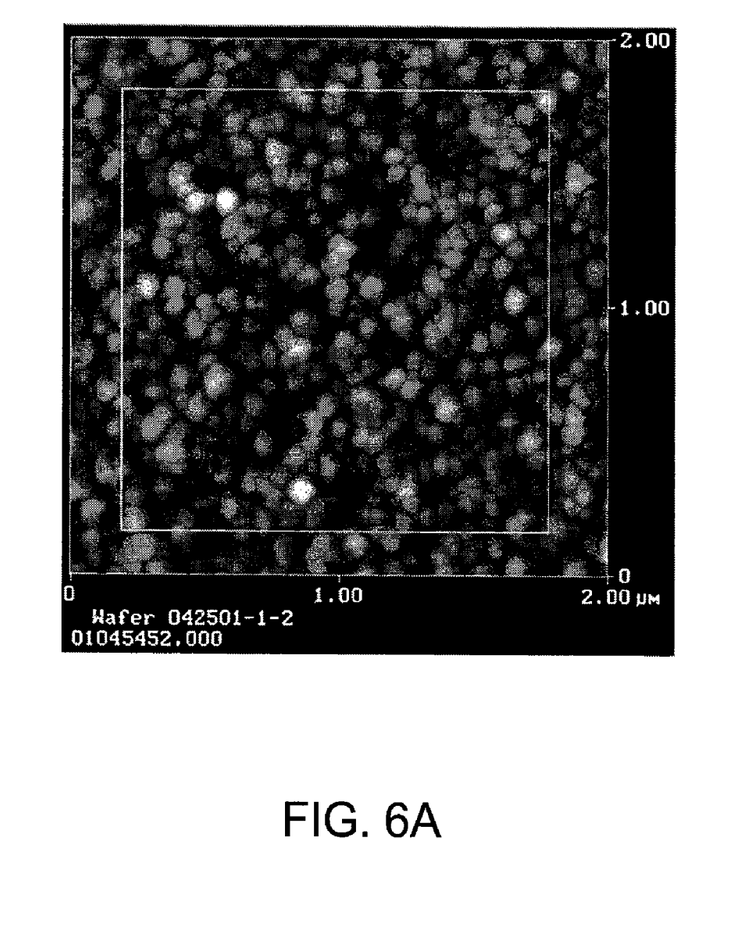
FIG. 6A shows surface roughness of 800 Å poly-SiGe deposited directly on thermal $SiO_2$. The Ge content is 30 atomic %.
Figure 6B:
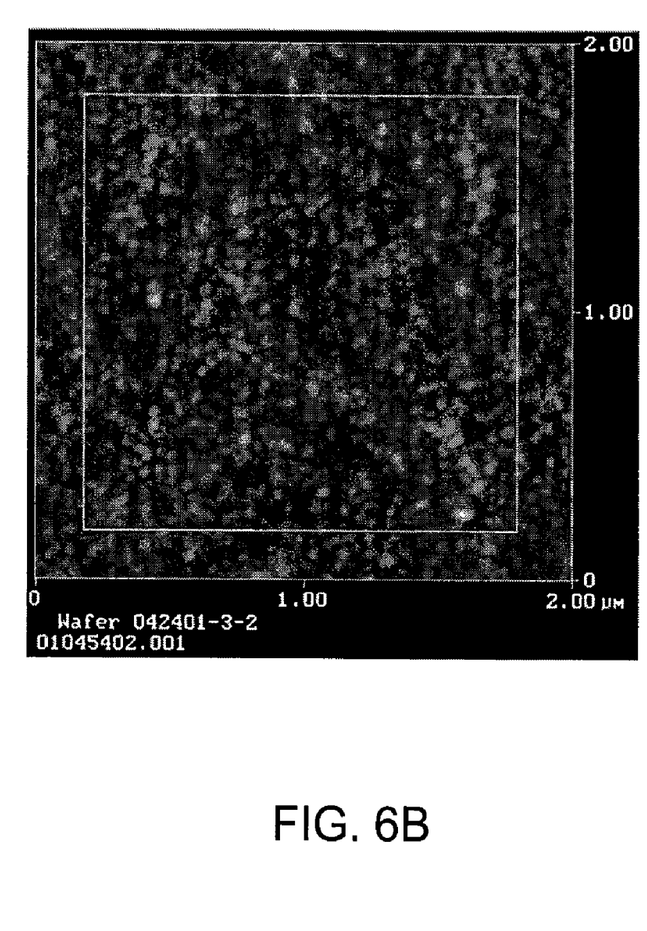
FIG. 6B shows surface roughness of 800 Å poly-SiGe deposited with an intervening 50 Å $\alpha$-Si seed layer deposited and with the process according to the invention. The Ge content is 30 atomic %.
Figure 7:
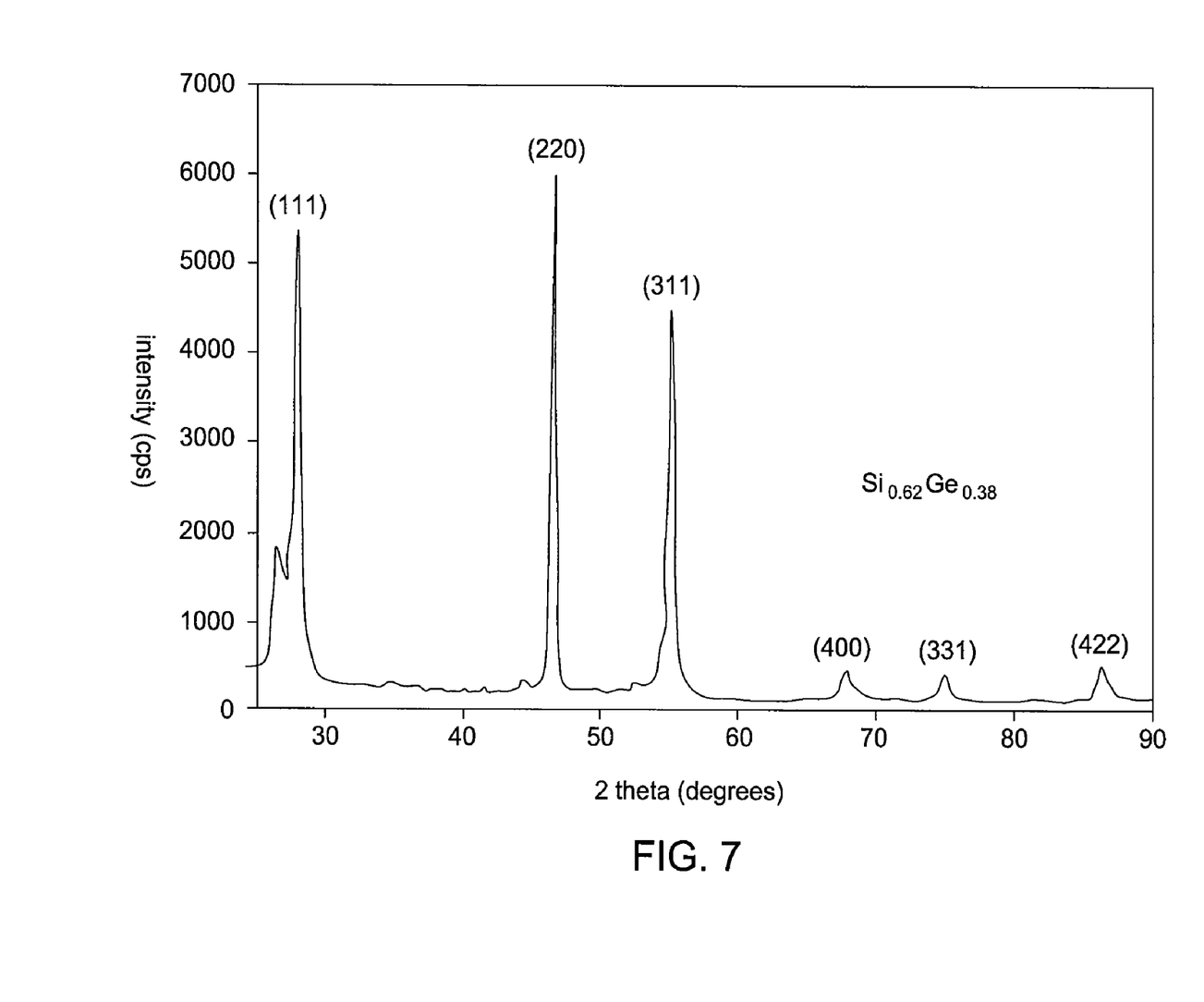
FIG. 7 shows the $\theta$-2$\theta$ XRD scan of poly-SiGe film showing the film crystallinity. The Ge content is 38 atomic %.

The influence of the α-Si seed layer on the roughness of the poly-SiGe is dramatic. In the absence of a seed layer, the surface roughness of a 800 Å poly-SiGe is about 39 Å (see FIG. 6A). In contrast, when a 800 Å poly-SiGe is deposited on a 50 Å α-Si seed layer described above, the surface roughness of the poly-SiGe film drops dramatically to about 21 Å (see FIG. 6B). The poly-SiGe film deposited on a smooth and continuous 50 Å α-Si seed layer also has a well defined crystal structure as exemplified by the θ-2θ X-ray XRD (X-ray defraction) scan (see FIG. 7).

For poly-SiGe/poly-Si stack, the morphology of poly-Si deposited on poly-SiGe is poor. The grain size distribution is broader compared to poly-Si deposited directly on the gate dielectric. The mean grain size is also larger since poly-Si growth on poly-SiGe is quasi-heteroepitaxial, i.e. the lattice spacing of poly-Si crystallites tends to follow the larger lattice spacing of the underlying poly-SiGe.

The method according to the invention for forming a poly-SiGe/poly-Si stack includes the step of inserting of a thin α-Si layer in between the poly-SiGe and poly-Si layers. The α-Si layer retains its amorphous microstructure at the poly-Si deposition temperature. The growth of poly-Si on poly-SiGe with an intervening layer of α-Si is not heteroepitaxial. The poly-Si grain structure is more akin to that obtained when the film is deposited directly on an amorphous surface such as thermal $SiO_2$.

Figure 8A:
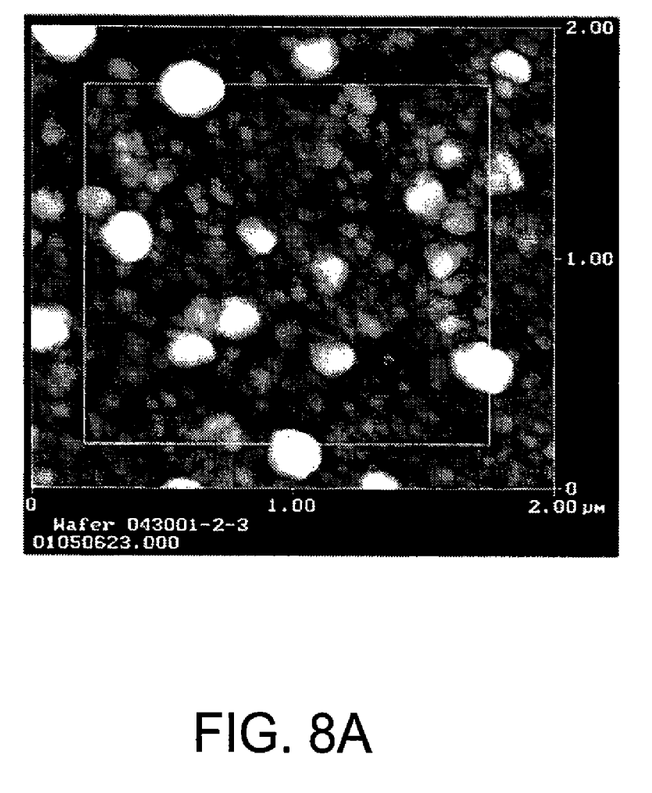
FIG. 8A shows the surface roughness of 1000 Å poly-SiGe/500 Å poly-Si stack for direct deposition of poly-Si on poly-SiGe.
Figure 8B:
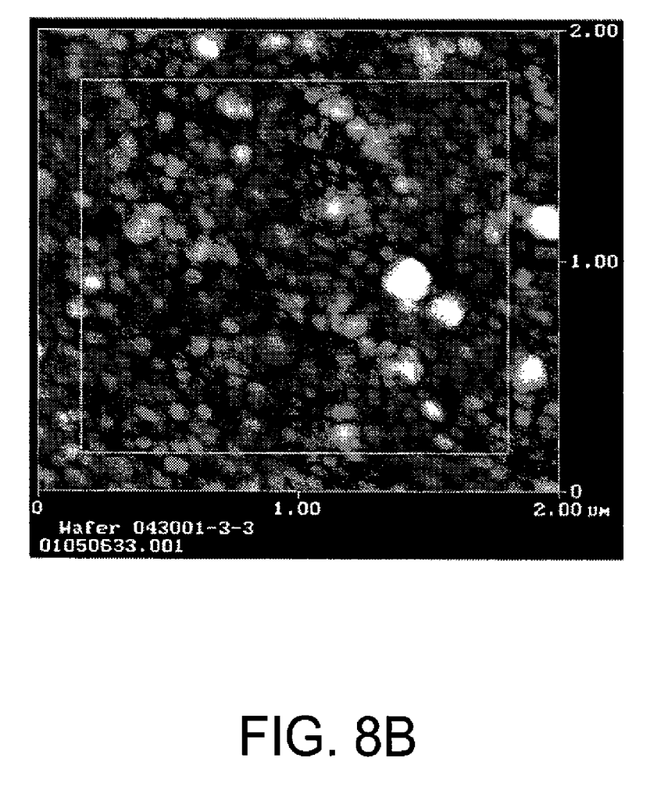
FIG. 8B shows the surface roughness of 1000 Å poly-SiGe/500 Å poly-Si stack for for a stack containing 100 Å $\alpha$-Si at the interface between poly-SiGe and poly-Si.

The smaller poly-Si grain size that is obtained when the poly-Si is deposited on poly-SiGe with an interposed layer of α-Si is confirmed by the reduced surface roughness of the stack. For example, when 1000 Å poly-Si is deposited directly on 500 Å poly-SiGe (without an α-Si seed layer), the surface roughness of the stack is about 58 Å (see FIG. 8A). The surface roughness decreases to about 34 Å (see FIG. 8B) when a 100 Å α-Si is interposed between the poly-Si and the poly-SiGe. In comparison, the surface roughness of 1500 Å poly-Si deposited directly on thermal $SiO_2$ is about 30 Å.

The α-Si deposition conditions used for this interfacial layer are described below.

EXAMPLE 4

Process to Deposit an Interfacial α-Si Layer Between Poly/SiGe and Poly/Si 2.0 slm $SiH_4$, 0.0 slm diluent $N_2$, 0.4 Torr, 520° C., 420 seconds to deposit 100 Å of α-Si.

In the example, the deposition temperature is chosen to be the same as that for the poly-SiGe so that the α-Si seed layer, the poly-SiGe and α-Si interfacial layer are all deposited at the same temperature before the temperature is raised for the poly-Si deposition.

The following process conditions were used for poly-Si deposition.

EXAMPLE 5

Process to Deposit a Poly/Si Layer 2.0 slm $SiH_4$, 0.0 slm diluent $N_2$, 0.4 Torr, 630° C., 420 seconds to deposit 1000 Å of poly-Si.

Materials other than α-Si may be used for the interfacial layer, but α-Si is best suited since it gets transformed to poly-Si during subsequent thermal annealing performed to activate and to diffuse implanted dopants. Following the anneal, a poly-SiGe/poly-Si stack results. The α-Si seed layer gets transformed to poly-SiGe during the anneal since the Ge from the poly-SiGe diffuses into the α-Si seed layer. Another advantage is that the α-Si can be deposited at the same temperature using the same reactants as poly-SiGe.

Another application for SiGe is the deposition of hemispherical grained silicon (HSG). Hemispherical grained silicon is commonly used in the bottom electrode stack for DRAM capacitors. Compared to smooth α-Si or poly-Si bottom electrode stacks, stacks incorporating HSG Si have a surface area that is 1.5-2.5× higher. The higher surface area increases the capacitance of the DRAM capacitor.

In the simplest technique, α-Si is deposited with $SiH_4$ or $SiH_4$ diluted in He, $H_2$, $N_2$, or Ar at pressures of 0.5-1.5 Torr and temperatures from 560° C.-600° C. At an intermediate temperature between 560° C. and 600° C., the morphology of the α-Si changes from smooth films to rough films with hemispherical grains. The temperature window for this mode of deposition is 10° C., which is generally too narrow to control in a production environment.

The deposition approach discussed above could be modified to make the process more manufacturable. The key concept is to dope the α-Si with Ge and adjust the deposition temperature to achieve hemispherical grain growth. Ge doping helps amorphous phase transition to the polycrystalline phase; thereby reducing the demands on temperature control. This transition temperature can drop 100° C. from 580° C. to 480° C. for high Ge content. Addition of Ge also increases the grain size that enlarges the size of the hemispherical grain. A common source for Ge is $GeH_4$. $GeH_4$ is an etchant for $SiO_2$ native oxides thereby suppressing their growth. Native oxides tend to inhibit the formation of HSG-Si. The HSG-SiGe can be capped with an undoped layer of α-Si if necessary for process integration.

All of these factors contribute to larger hemispherical grains with increased surface area. Ge doping can be advantageously used in the other two HSG-Si deposition techniques as well. Some of the potential improvements are described as following. One of the techniques is to deposit a Ge doped α-Si layer and then vacuum anneal or anneal in an ambient of $H_2$ or $GeH_4/H_2$ to form HSG-SiGe. If $GeH_4$ is used it should be sufficiently dilute to prevent Ge deposition, but high enough to etch native oxides that may grow during anneal. Native oxides tend to reduce surface diffusion and tend to inhibit the formation of HSG film. The other technique is to seed the α-Si base layer with SiGe nuclei instead of pure Si nuclei and then vacuum anneal or anneal in an ambient of $H_2$ or $GeH_4/H_2$ to form HSG-SiGe. If $GeH_4$ is used it should be sufficiently dilute to prevent Ge deposition, but high enough to etch native oxides that may grow during anneal. Native oxides tend to reduce surface diffusion and tend to inhibit the formation of HSG film.

Figure 9:
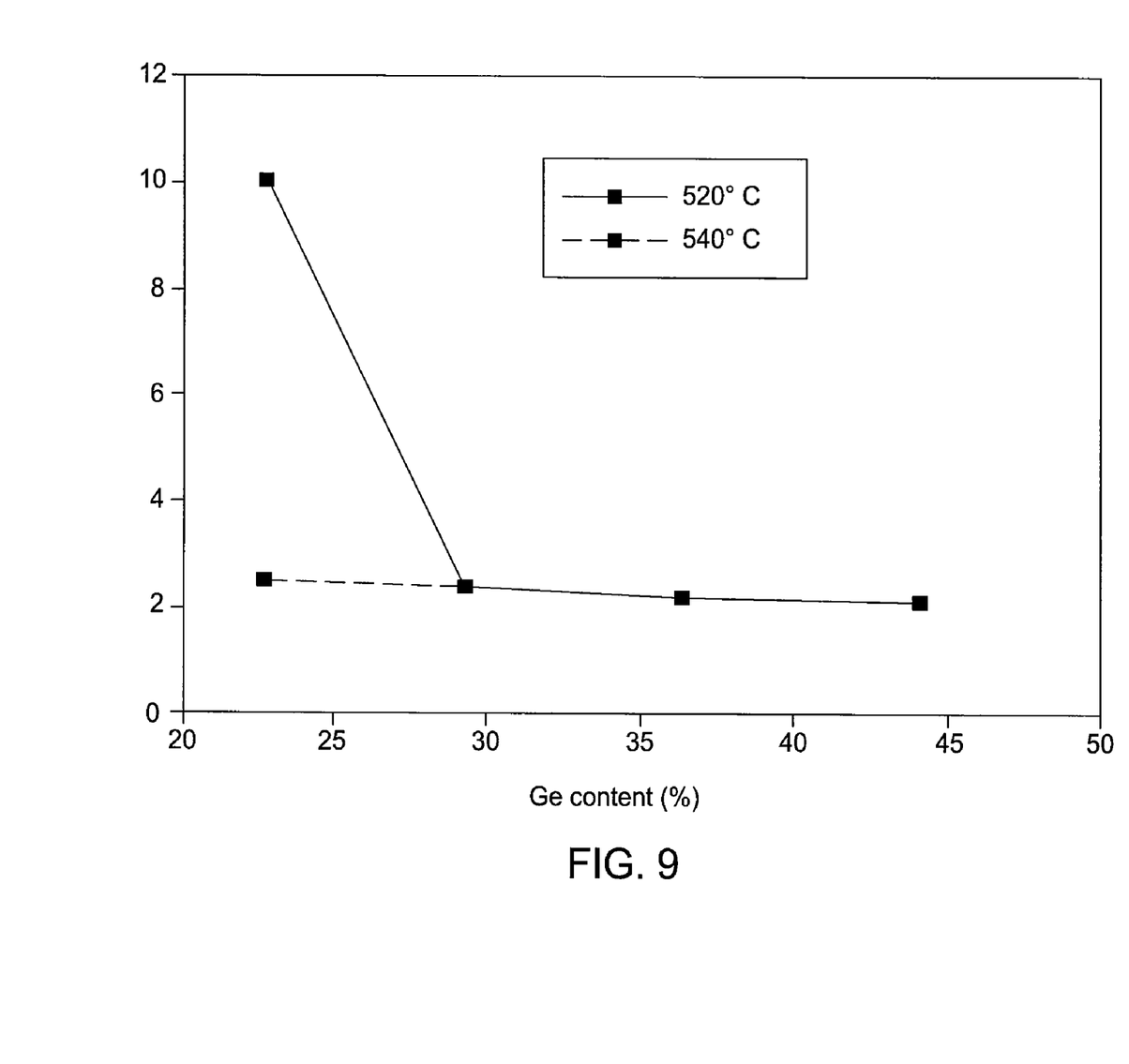
FIG. 9 shows the surface roughness of poly-SiGe as a function of Ge content and deposition temperature.

The increase in surface roughness with the addition of Ge is seen in FIG. 9. As the Ge content in the film is lowered while holding the deposition temperature constant, the surface roughness of the film increases sharply at a Ge content less than about 30%. At this critical Ge content of less than about 30%, the deposition temperature and the transition temperature are similar. Thus deposition temperature as well as Ge content can control the transition to the HSG-SiGe phase. If the deposition temperature is increased at this critical Ge content, the surface roughness drops as the film transitions from the HSG-SiGe phase to the poly-SiGe phase.

Yet another application for SiGe is the deposition of in-situ doped poly-Si. In-situ doped Si films are commonly used in memory devices as gate electrodes, word lines, bit lines, capacitor electrodes and capacitor plates. Generally, these films are deposited as α-Si that are in-situ doped with phosphorus, boron or arsenic. A high temperature post-deposition furnace anneal or rapid thermal anneal is performed to activate the dopant and transform the film into large grained low resistivity poly-Si.

In certain applications such as floating gates for non-volatile memories where a light as-deposited doping concentration is required, a fine-grained as-deposited poly-Si microstructure with randomly oriented grains is desired. Earlier it was shown that Ge doping lowers the α-Si to poly-Si transition temperature. In other words, Ge doping favors the α-SiGe to poly-SiGe transition. Thus one novel way to obtain an as-deposited poly-Si microstructure for in-situ doped films is to add $GeH_4$ or other Ge containing source gases to the silicon containing source gases used for poly-Si deposition. For some dopants, especially boron, Ge doping also enhances dopant activation. In this manner, in-situ doped poly-SiGe films are obtained at process temperatures that would normally yield in-situ doped α-Si. These poly-SiGe films may be capped with α-Si or poly-Si. As described earlier, a seed layer of undoped or in-situ doped α-Si may be necessary to initiate poly-SiGe deposition.

Another application for in-situ doped films is MEMS (micromechanical systems) and TFT (thin film transistor) applications. Thermal budget is a serious constraint for MEMS processing. Typically processing temperatures must remain below 600° C. to avoid damage to the micromachined components. For applications such as these, a low temperature (<600° C.) in-situ doped poly-Si film with activated dopant is desirable. Once again, Ge doping can be used to achieve such a film. First in-situ doped a-SiGe is deposited below the amorphous to polycrystalline transition for SiGe (typically 475-550° C.). The film is then annealed in-situ at temperatures below 600° C. to crystallize the film and activate the dopant. During anneal, the film transforms from the amorphous phase to the polycrystalline phase through a process known as solid phase recrystallization. Ge doping lowers the temperature for solid phase recrystallization of α-Si from above 600° C. to below 550° C.

In this manner, the poly-SiGe deposition techniques introduced for the primary application of advanced gate electrodes, can be advantageously applied to HSG-Si formation, in-situ doped poly-Si deposition and low temperature in-situ doped poly-Si.

Accordingly, while the present invention has been disclosed in connection with various embodiments thereof, it should be understood that other embodiments might fall within the spirit and scope of the invention, as defined by the following claims.

What is claimed is:

1. A method of depositing an α-Si layer on a substrate, comprising:
   placing the substrate in a chamber;
   depositing an α-Si nucleation layer on said substrate using a first Si-containing source gas provided into the chamber;
   stopping flow of the first Si-containing source after the α-Si nucleation layer has been formed;
   depositing α-Si on the α-Si nucleation layer using a second Si-containing source gas to form an α-Si layer of less than about 50 Å thickness;
   depositing a poly-SiGe layer on the α-Si layer; and
   thermally annealing the α-Si nucleation layer, the α-Si nucleation layer and the α-Si layer to convert the α-Si nucleation layer and the α-Si layer into poly-SiGe layers.

2. The method of claim 1, wherein the first Si-containing source gas is $Si_2H_6$.

3. The method of claim 2, wherein the first Si-containing source gas is diluted with a non-reactive gas.

4. The method of claim 3, wherein the non-reactive gas comprises $N_2$, Ar, $H_2$, He, or a combination thereof.

5. The method of claim 1, wherein the second Si-containing source gas is $SiH_4$.

6. The method of claim 1 further comprising:
   a third Si-containing source gas provided with the first Si-containing source gas.

7. The method of claim 1, wherein the second Si-containing source gas is introduced a pre-determined period of time after the first Si-containing source gas is introduced.

8. A method of forming a gate stack on a substrate, comprising:
   providing a substrate having a dielectric layer disposed thereon;
   depositing a first α-Si layer on the dielectric layer;
   depositing a poly-SiGe layer on the first α-Si layer;
   depositing a second α-Si layer on the poly-SiGe layer;
   depositing a poly-Si layer on the second α-Si layer;
   thermally annealing the gate stack formed on the substrate; and
   converting the first and the second α-Si layers into a poly-SiGe layer.

9. The method of claim 8, wherein the first α-Si layer, the poly-SiGe layer and the second α-Si layer are deposited at a same temperature.

10. The method of claim 9, wherein a thickness of the second α-Si layer is between about 50 Å to about 300 Å.

11. The method of claim 9, wherein a thickness of the first α-Si layer is between about 30 Å to about 50 Å.

12. The method of claim 1, further comprising:
    depositing a poly-SiGe layer on the α-Si layer.

13. The method of claim 1, wherein a thickness of the α-Si layer is between about 30 Å to about 50 Å.

14. The method of claim 1, wherein a process time for providing the first and the second silicon-containing source gas has a ratio about 1:5.

15. The method of claim 8, wherein the first α-Si layer includes a nucleation layer and a thin α-Si layer.

16. The method of claim 15, wherein the nucleation layer of the first α-Si layer is formed by supplying a first silicon-containing gas into a process chamber.

17. The method of claim 16, wherein the thin α-Si layer of the first α-Si layer is formed by supplying a second silicon-containing gas into the process chamber.

18. The method of claim 9, wherein the poly-Si layer is deposited at a temperature about 100 degree Celsius higher than the temperature of depositing the first α-Si layer, the poly-SiGe layer and the second α-Si layer.

* * * * *

UNITED STATES PATENT AND TRADEMARK OFFICE
CERTIFICATE OF CORRECTION

| | |
|---|---|
| PATENT NO. | : 7,354,848 B2 |
| APPLICATION NO. | : 11/420940 |
| DATED | : April 8, 2008 |
| INVENTOR(S) | : Paranjpe et al. |

It is certified that error appears in the above-identified patent and that said Letters Patent is hereby corrected as shown below:

Title page, item [56]
In the References Cited:

Please delete "6,552,583 B1 3/2002 Brors et al." and insert --6,352,593 B1 3/2002 Brors et al.-- therefore;

Please delete "6,552,594 B2 3/2002 Cook" and insert --6,352,594 B2 3/2002 Cook--.

Signed and Sealed this

Twenty-third Day of September, 2008

JON W. DUDAS
*Director of the United States Patent and Trademark Office*